(12) United States Patent
Jin (10) Patent No.: US 9,013,037 B2
(45) Date of Patent: Apr. 21, 2015

(54) SEMICONDUCTOR PACKAGE WITH IMPROVED PILLAR BUMP PROCESS AND STRUCTURE

(75) Inventor: Yonggang Jin, Singapore (SG)

(73) Assignee: STMicroelectronics Pte Ltd., Singapore (SG)

( * ) Notice: Subject to any disclaimer, the term of this patent is extended or adjusted under 35 U.S.C. 154(b) by 94 days.

(21) Appl. No.: 13/232,780

(22) Filed: Sep. 14, 2011

(65) Prior Publication Data

US 2013/0062764 A1  Mar. 14, 2013

(51) Int. Cl.
*H01L 23/34* (2006.01)
*H01L 23/00* (2006.01)
*H01L 23/31* (2006.01)

(52) U.S. Cl.
CPC ............ *H01L 24/11* (2013.01); *H01L 23/3114* (2013.01); *H01L 2924/01029* (2013.01); *H01L 2924/14* (2013.01); *H01L 2224/11622* (2013.01); *H01L 24/03* (2013.01); *H01L 24/05* (2013.01); *H01L 24/13* (2013.01); *H01L 24/16* (2013.01); *H01L 2224/0401* (2013.01); *H01L 2224/05567* (2013.01); *H01L 2224/11334* (2013.01); *H01L 2224/11462* (2013.01); *H01L 2224/11849* (2013.01); *H01L 2224/13082* (2013.01); *H01L 2224/13111* (2013.01); *H01L 2224/13139* (2013.01); *H01L 2224/13147* (2013.01); *H01L 2224/16225* (2013.01); *H01L 2224/94* (2013.01); *H01L 2224/03912* (2013.01); *H01L 2224/05572* (2013.01)

(58) Field of Classification Search
CPC ........................... H01L 24/05–24/18
USPC .................................................. 257/735–778
See application file for complete search history.

(56) References Cited

U.S. PATENT DOCUMENTS

| | | | |
|---|---|---|---|
| 4,074,342 A | 2/1978 | Honn et al. | |
| 4,603,374 A | 7/1986 | Wasielewski | |
| 4,715,115 A | 12/1987 | King et al. | |
| 5,222,014 A | 6/1993 | Lin | |
| 5,309,011 A | 5/1994 | Tazunoki et al. | |
| 5,355,580 A | 10/1994 | Tsukada | |
| 5,488,200 A | 1/1996 | Tsukada | |
| 5,936,843 A | 8/1999 | Ohshima et al. | |

(Continued)

OTHER PUBLICATIONS

Chua et al., "Method for Producing Vias in Fan-Out Wafers Using Dry Film and Conductive Paste, and a Corresponding Semiconductor Package," U.S. Appl. No. 12/977,697, filed Dec. 23, 2010, 34 pages.

(Continued)

*Primary Examiner* — Matthew W Such
*Assistant Examiner* — Ali Naraghi
(74) *Attorney, Agent, or Firm* — Seed IP Law Group PLLC (57) ABSTRACT

A flip chip structure formed on a semiconductor substrate includes a first plurality of copper pillars positioned directly over, and in electrical contact with respective ones of a plurality of contact pads on the front face of the semiconductor substrate. A layer of molding compound is positioned on the front face of the substrate, surrounding and enclosing each of the first plurality of pillars and having a front face that is coplanar with front faces of each of the copper pillars. Each of a second plurality of copper pillars is positioned on the front face of one of the first plurality of copper pillars, and a solder bump is positioned on a front face of each of the second plurality of pillars.

13 Claims, 7 Drawing Sheets

(56) References Cited

U.S. PATENT DOCUMENTS

| | | |
|---|---|---|
| 6,188,127 B1 | 2/2001 | Senba et al. |
| 6,253,992 B1 | 7/2001 | Fjelstad |
| 6,271,469 B1 | 8/2001 | Ma et al. |
| 6,344,682 B1 | 2/2002 | Tomita |
| 6,350,668 B1 | 2/2002 | Chakravorty |
| 6,680,529 B2* | 1/2004 | Chen et al. ............. 257/700 |
| 6,717,245 B1 | 4/2004 | Kinsman et al. |
| 6,815,254 B2 | 11/2004 | Mistry et al. |
| 6,828,665 B2 | 12/2004 | Pu et al. |
| 6,882,054 B2 | 4/2005 | Jobetto |
| 6,940,169 B2 | 9/2005 | Jin et al. |
| 7,045,899 B2* | 5/2006 | Yamane et al. ........... 257/777 |
| 7,064,440 B2 | 6/2006 | Jobetto et al. |
| 7,067,911 B1 | 6/2006 | Lin et al. |
| 7,122,748 B2 | 10/2006 | Yamada |
| 7,141,873 B2 | 11/2006 | Aoyagi |
| 7,192,805 B2 | 3/2007 | Jobetto |
| 7,193,301 B2 | 3/2007 | Yamaguchi |
| 7,247,947 B2 | 7/2007 | Wakabayashi et al. |
| 7,345,361 B2 | 3/2008 | Mallik et al. |
| 7,388,293 B2 | 6/2008 | Fukase et al. |
| 7,489,032 B2 | 2/2009 | Jobetto |
| 7,535,509 B2 | 5/2009 | Takayama |
| 7,642,128 B1 | 1/2010 | Lin et al. |
| 7,671,459 B2 | 3/2010 | Corisis et al. |
| 7,714,453 B2 | 5/2010 | Khan et al. |
| 7,772,687 B2 | 8/2010 | Inoue |
| 7,825,520 B1 | 11/2010 | Longo et al. |
| 7,871,861 B2 | 1/2011 | Song et al. |
| 7,910,405 B2 | 3/2011 | Okada et al. |
| 7,932,613 B2* | 4/2011 | Child ..................... 257/779 |
| 7,989,707 B2 | 8/2011 | Yamano et al. |
| 8,003,496 B2 | 8/2011 | Oh et al. |
| 8,004,074 B2 | 8/2011 | Mori et al. |
| 8,004,092 B2 | 8/2011 | Lin et al. |
| 8,035,213 B2 | 10/2011 | Lee et al. |
| 8,089,777 B2 | 1/2012 | Negishi |
| 8,105,915 B2 | 1/2012 | Camacho et al. |
| 8,106,495 B2 | 1/2012 | Kajiki |
| 8,119,454 B2 | 2/2012 | Jin |
| 8,125,066 B1 | 2/2012 | Kang |
| 8,158,888 B2 | 4/2012 | Shen et al. |
| 8,159,070 B2* | 4/2012 | Lin et al. ................ 257/758 |
| 8,222,964 B2 | 7/2012 | Avni et al. |
| 8,241,964 B2 | 8/2012 | Pagaila et al. |
| 8,482,134 B1 | 7/2013 | Darveaux et al. |
| 8,610,268 B2* | 12/2013 | Kobayashi et al. ........ 257/737 |
| 2001/0026010 A1 | 10/2001 | Horiuchi et al. |
| 2002/0070443 A1 | 6/2002 | Mu et al. |
| 2004/0033643 A1* | 2/2004 | Odegard et al. .......... 438/120 |
| 2005/0098891 A1 | 5/2005 | Wakabayashi et al. |
| 2005/0242422 A1 | 11/2005 | Klein et al. |
| 2006/0091521 A1 | 5/2006 | Cady et al. |
| 2006/0163715 A1 | 7/2006 | Pendse |
| 2006/0256222 A1 | 11/2006 | Tsai |
| 2007/0090508 A1 | 4/2007 | Lin et al. |
| 2007/0267743 A1 | 11/2007 | Mizusawa et al. |
| 2008/0017968 A1 | 1/2008 | Choi et al. |
| 2008/0083988 A1 | 4/2008 | Lin |
| 2009/0057895 A1* | 3/2009 | Lin et al. ................ 257/737 |
| 2009/0127688 A1 | 5/2009 | Lee et al. |
| 2009/0212412 A1 | 8/2009 | Yoon |
| 2009/0261466 A1 | 10/2009 | Pagaila et al. |
| 2009/0309224 A1* | 12/2009 | Lin et al. ................ 257/758 |
| 2010/0072600 A1 | 3/2010 | Gerber |
| 2010/0090323 A1 | 4/2010 | Shinoda et al. |
| 2010/0117212 A1 | 5/2010 | Corisis et al. |
| 2010/0148316 A1 | 6/2010 | Kim et al. |
| 2010/0244216 A1 | 9/2010 | Huang et al. |
| 2010/0244263 A1* | 9/2010 | Lin et al. ................ 257/758 |
| 2011/0024905 A1* | 2/2011 | Lin et al. ................ 257/738 |
| 2011/0032400 A1 | 2/2011 | Yang |
| 2011/0156230 A1 | 6/2011 | Goh |
| 2011/0156240 A1 | 6/2011 | Luan et al. |
| 2011/0156250 A1 | 6/2011 | Goh et al. |
| 2011/0157452 A1 | 6/2011 | Goh et al. |
| 2011/0157853 A1 | 6/2011 | Goh |
| 2011/0210413 A1* | 9/2011 | Huang et al. ............. 257/433 |
| 2011/0241055 A1* | 10/2011 | Urasaki et al. ............ 257/98 |
| 2011/0241192 A1 | 10/2011 | Ding et al. |
| 2011/0260303 A1 | 10/2011 | Pagaila et al. |
| 2011/0291274 A1 | 12/2011 | Meyer et al. |
| 2011/0316146 A1 | 12/2011 | Pagaila et al. |
| 2011/0316156 A1 | 12/2011 | Pagaila et al. |
| 2012/0049364 A1 | 3/2012 | Sutardja et al. |
| 2012/0299191 A1 | 11/2012 | Camacho |
| 2013/0037929 A1 | 2/2013 | Essig et al. |
| 2013/0105973 A1 | 5/2013 | Gan et al. |
| 2013/0200528 A1 | 8/2013 | Lin et al. |

OTHER PUBLICATIONS

Jin, "Apparatus and Method for Placing Solder Balls," U.S. Appl. No. 13/340,275, filed Dec. 29, 2011, 31 pages.

ASE Tech Forum, "ASE PoP (TRD PoP & MAP PoP)," The Advanced Semiconductor Engineering Group, Sep. 2007, 37 pages.

Goh, "Fan-Out Wafer Level Package With Polymeric Layer for High Reliability," U.S. Appl. No. 12/649,130, filed Dec. 29, 2009, 31 pages.

Johnson, "STATS ChipPAC Expands eWLB to Reconstituted 300 mm Wafers," *Semiconductor International*, published Apr. 15, 2010, downloaded Feb. 28, 2012 from http://english.ime.cas.cn/ns/es/201004/t20100429_53569.html, Microelectronice of Chinese Academy of Sciences, 2 pages.

* cited by examiner

SEMICONDUCTOR PACKAGE WITH IMPROVED PILLAR BUMP PROCESS AND STRUCTURE

BACKGROUND OF THE INVENTION

1. Technical Field

This disclosure is related to the manufacture of semiconductor devices, and in particular, the manufacture of flip-chip structures on semiconductor wafers.

2. Description of the Related Art

Semiconductor devices are packaged in a large variety of structures. A configuration that is used with increasing frequency in semiconductor packaging is the flip-chip. This term refers to a process and structure in which electrical contacts, e.g., solder balls, are placed on a semiconductor die in contact with contact pads of the die, forming a ball grid array (BGA) on the face of the die. The die is then placed active-side down on a carrier substrate with the solder balls in contact with "landing pads" of the substrate. Finally, in a reflow step, the solder balls are heated until they melt and form a solder joint between the contact pads of the die and the landing pads of the substrate. Such an arrangement can be used, for example, to bond a semiconductor chip directly to a circuit board, or to a chip carrier of a larger package that includes a redistribution layer and a second BGA with solder balls spaced at a coarser pitch to accommodate the spacing of landing pads on a circuit board.

In response to market pressure and technological advancement, circuit density in semiconductor devices continues to increase, resulting in tighter spacing between contact pads, and the need for finer pitch arrays, on devices that employ BGA structures. As array pitch is made finer, the solder balls must be made smaller to prevent short circuits between solder balls. This reduces the space between the semiconductor die and the substrate.

It should be noted that the coefficient of thermal expansion (CTE) of silicon is about 2.5 ppm/° C., while that of a typical package laminate base is around 17 ppm/° C. During operation, heat generated by operation of the integrated circuit in the die causes thermal expansion of the die and the substrate. Thermal mismatch between the die and the substrate results in shear stress on the solder joints of the BGA. Where larger solder balls are used, the solder joint itself can deform to a limited degree, permitting the substrate and die to expand at different rates without damage, but with smaller solder balls, the solder joints are less able to compensate, and joint failure can result. It has been found that as offset of the die from the substrate decreases, joint failure increases. However, maintaining a particular minimum offset imposes a minimum solder ball size, which in turn imposes a minimum pitch.

Figure 1:
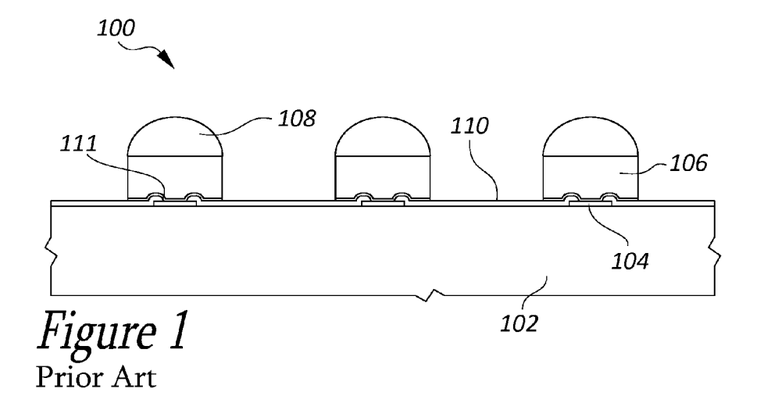
FIG. 1 is a diagrammatic side view of flip-chip structure that includes pillar bumps formed on a semiconductor substrate, according to known art.

One solution to this problem is the formation of pillars on which smaller solder bumps are formed. FIG. 1 shows a flip-chip structure 100 that includes a semiconductor die 102 with a repassivation layer 110 positioned thereon. Openings 111 in the repassivation layer 110 expose contact pads 104 of the semiconductor die 102. Copper pillars 106 are formed on of the die 102 over, and in electrical contact with the contact pads 104, and solder bumps 108 are formed on the ends of the pillars 106. When this structure is placed with the solder bumps in contact with landing pads of a substrate, the copper pillars 106 do not reflow with the solder bumps 108, so the die 102 remains spaced apart from the substrate by the pillars. During operation, differences in expansion can be accommodated by the copper pillars 106, thereby increasing the reliability of the solder joints.

Figure 2:
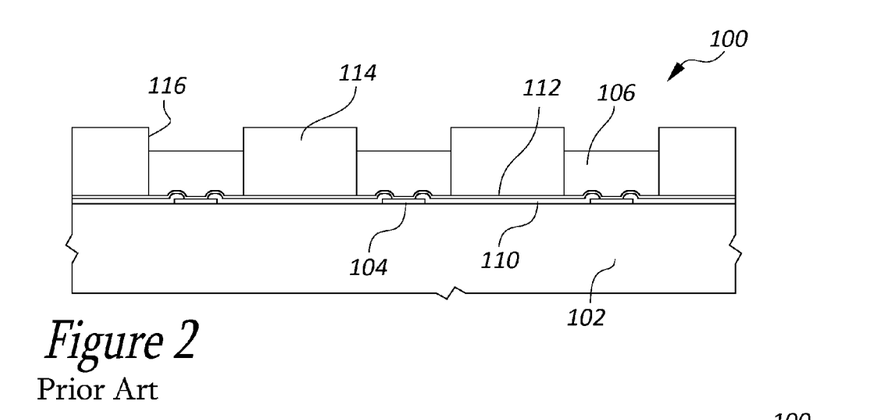
FIGS. 2 and 3 are diagrammatic side views of respective stages in one known process for producing the pillar bumps of FIG. 1.
Figure 3:
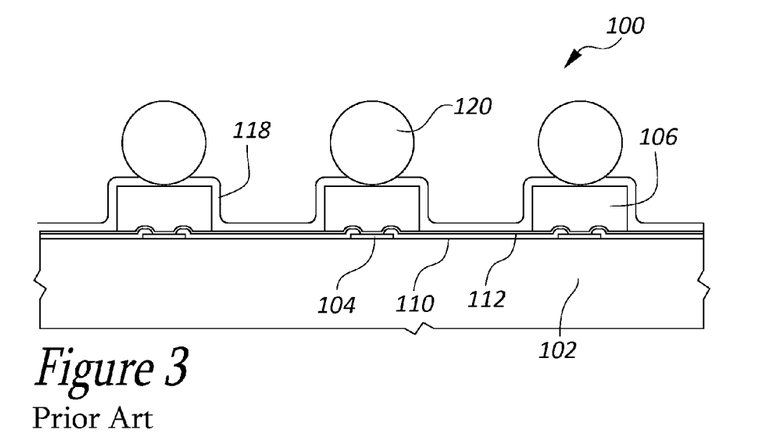

FIGS. 2 and 3 show respective stages in one known process for producing pillar-bumps. As shown in FIG. 2, a seed layer 112 or under-bump metallic layer (UBM), typically of Ti/Cu or Ti/W/Cu, is deposited over the repassivation layer 110 and contact pads 104. A resist layer 114 is then deposited over the seed layer 112 and patterned to form openings 116 that expose the seed layer 112 in positions corresponding to the contact pads 104. Copper is then plated onto the seed layer 112 in the openings 115 to form the copper pillars 106. The resist layer 114 is then stripped away, leaving the pillars 106, after which a layer of flux 118 is deposited over the substrate, including the pillars 106. Solder balls 120 are then positioned on the copper pillars 106 and pressed into the flux layer 118, which holds them in position.

The wafer 100 is then heated until the solder balls 120 reflow and form the bumps 108, the flux serving to exclude oxygen from the solder bond. Finally, the remaining flux 118 is cleaned from the wafer 100 and an etch is performed to remove the exposed portions of the seed layer 112, leaving pillar bumps on the wafer as shown in FIG. 1.

The process described above is useful for forming pillar bumps at pitches of greater than around 200 µm. At finer pitches, the various known methods for positioning solder balls in "ball drop" operations become less reliable. Lack of a single solder ball can render useless the entire device. At the same time, the number of contact pads that can be formed on a semiconductor die of a given size increases in inverse relation to the pitch size. Semiconductor devices can have 1-3000 contacts or more. Failure to properly position one solder ball in 10,000 could result in a rejection rate of greater than 10%.

Figure 4:
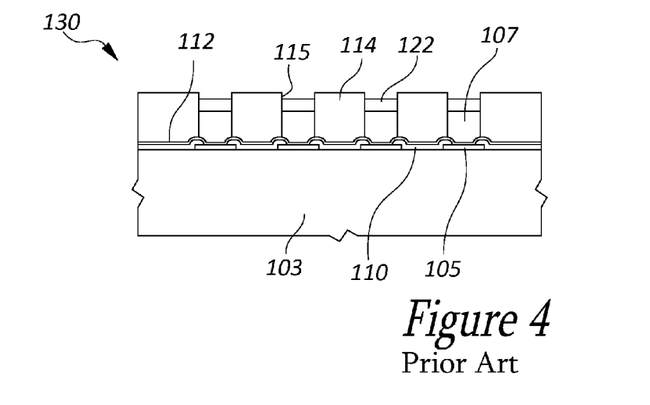
FIGS. 4 and 5 are diagrammatic side views of respective stages in another known process for producing pillar bumps on a semiconductor substrate.
Figure 5:
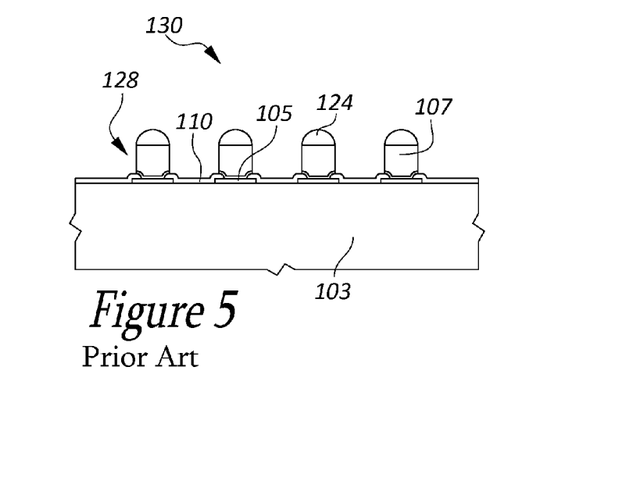

For these reasons, at pitches that are finer than around 200 µm, solder paste is commonly used, deposited on the Cu pillars 106 in the openings 116 of FIG. 2, after which the wafer is heated to reflow the solder paste. At even finer pitches, especially below 100 µm, solder paste becomes unreliable, inasmuch as the size of the metallic particles of the paste become a factor, and because of an increasing tendency to leave voids. It is therefore most common, at such pitch levels, to deposit solder material by electroplating, as described with reference to FIGS. 4 and 5, which show a wafer 130. The wafer 130 includes a semiconductor substrate 103 that is similar in structure to the substrate 102 of FIGS. 1-3 except that the contact pads 105 are at a finer pitch than those shown in FIGS. 1-3. The process follows the same steps described above with reference to FIG. 2. Following the plating process used to form the Cu pillars 107, a second electroplating step is performed to deposit a quantity of solder 122 on the tops of the pillars 107, as shown in FIG. 4. The resist layer 114 is then removed, the seed layer 112 is removed by etching, and the solder 122 is reflowed to form the bumps 124 on the Cu pillars 107, forming pillar bumps 128, as shown in FIG. 5. Following formation of the pillar bumps 128, the wafer 103 is cut into a plurality of individual dice, each of which is then positioned facing a receiving support structure such as, e.g., a chip carrier laminate, with the solder bumps 124 in contact with contact pads of the carrier. The solder is again reflowed to bond the die to the laminate.

A particular problem with this approach is that the solder electroplating process is generally limited to plating a binary alloy. In other words, a plated solder can be an alloy of no more than two metals. Alloys of tin and lead are most commonly plated.

BRIEF SUMMARY

According to an embodiment, a flip chip structure formed on a semiconductor substrate is provided, including a first plurality of copper pillars positioned directly over, and in electrical contact with respective ones of a plurality of contact pads on the front face of the semiconductor substrate. A layer of molding compound is positioned on the front face of the substrate, surrounding and enclosing each of the first plurality of pillars and having a front face that is coplanar with front faces of each of the copper pillars. Each of a second plurality of copper pillars is positioned on the front face of one of the first plurality of copper pillars, and a solder bump is positioned on a front face of each of the second plurality of pillars.

According to an embodiment, pillars are formed on the front face of a semiconductor substrate by plating metal into openings defined in a layer of dry film resist positioned on the front face of the substrate. Before removing the resist, a solder ball is deposited onto the front face of each of the pillars, inside each of the openings.

According to another embodiment, a plurality of pillars is formed on the front face of a semiconductor substrate, and a layer of molding compound is deposited over the pillars and cured. The layer of molding compound is then thinned to expose front faces of each of the pillars. Contact structures are then formed on the front surface of the layer of molding compound in directly over, and in electrical contact with respective ones of the pillars. The contact structures can be solder balls, additional pillars with solder bumps on their respective front faces, contact pads with solder balls, etc.

DETAILED DESCRIPTION

Figure 6:
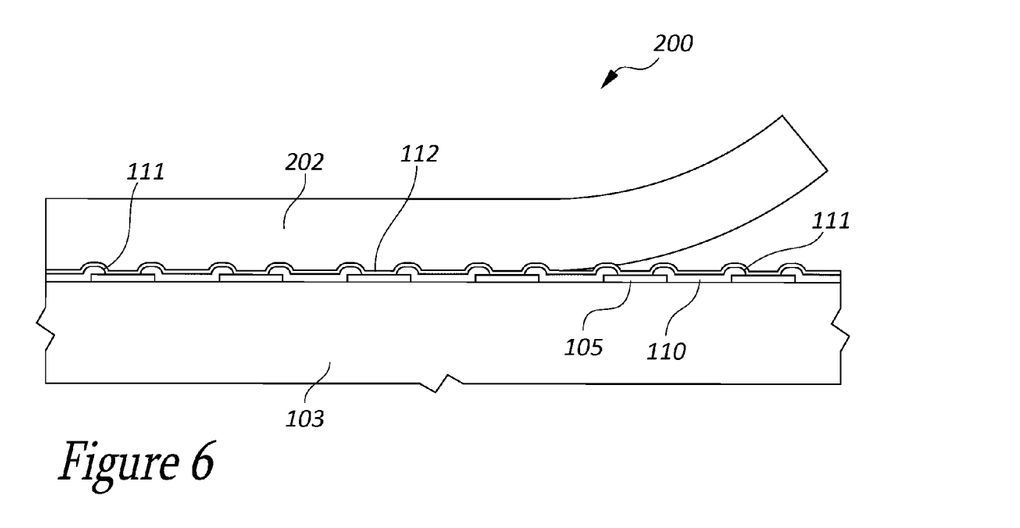
FIGS. 6-10 are diagrammatic side views of a portion of a wafer at respective stages of manufacture of pillar bumps, according to an embodiment.

FIGS. 6-10 are diagrammatic side views of a portion of a wafer 200 at respective stages of manufacture of pillar bumps, according to an embodiment. In particular, a process is shown for forming pillar bumps having an extremely fine pitch of less than about 60-80 µm. In FIG. 6, a semiconductor substrate 103 is shown, with a repassivation layer 110 positioned thereon. Openings 111 in the repassivation layer 110 expose contact pads 105 of the semiconductor substrate 103. The semiconductor substrate 103 will have previously been processed to form an integrated circuit thereon, and that the contact pads 105 are positioned on the active face of the substrate in electrical contact with respective terminals of the integrated circuit. According to other embodiments, a microelectromechanical device is formed in the substrate 103, with terminals in contact with the contact pads 105. An electrically conductive seed layer 112 is deposited over the repassivation layer 110, and a layer of photosensitive dry film resist 202 is positioned over the active face of the substrate 103. Dry film resist is discussed in detail in U.S. patent application Ser. No. 12/977,697, filed Dec. 23, 2010, and incorporated herein by reference in its entirety.

Figure 7:
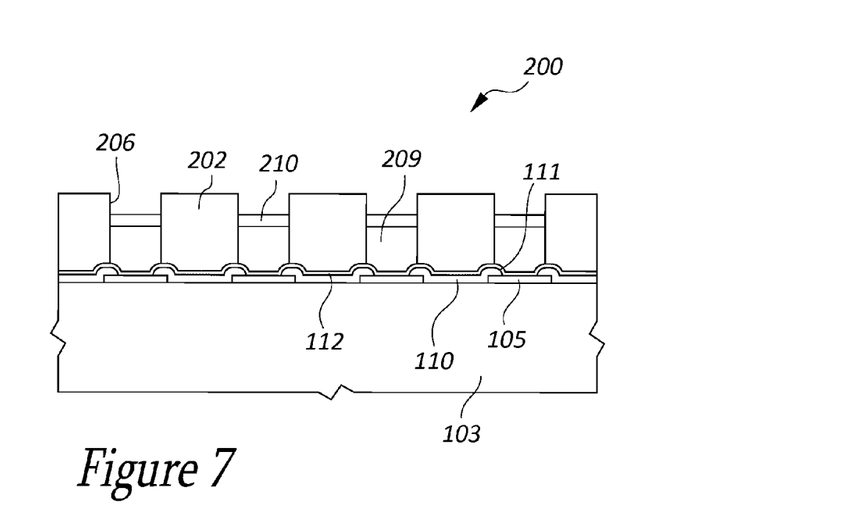

The dry film 202 is patterned to form openings 206 over respective contact pads 105 as shown in FIG. 7. A metal layer, preferably copper or copper alloy, is plated onto the exposed portions of the seed layer 112, thereby forming pillars 208 on contact pads 105 of the substrate 103. According to an embodiment, the openings 206 have a diameter in a range of about 15-40 µm, and pillars 214 are plated to a thickness in a range of about 30-80 µm.

A layer of flux 210 is deposited in the openings 206 on the tops of the pillars 208. This can be done using a printing process or with a squeegee or doctor blade. If deposited by squeegee or doctor blade, the flux 210 will substantially fill each of the openings 206. In such a case, the flux can include a volatile solvent component that is evaporated after deposition to reduce the volume of flux in each opening.

Figure 8:
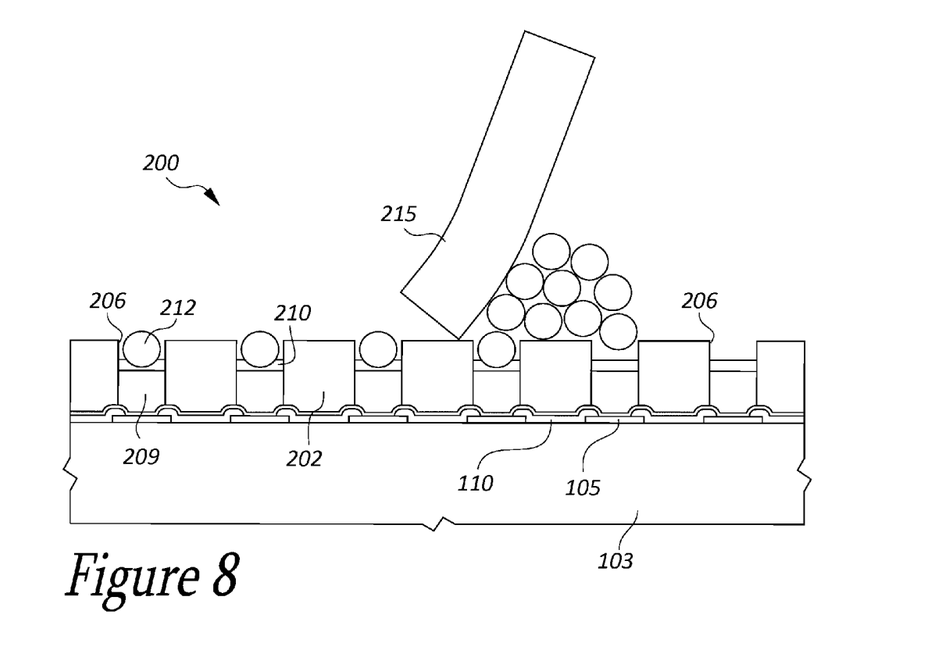

Turning to FIG. 8, a solder ball 212 is then placed in each opening 206. This can be done, for example, by wiping a quantity of solder balls 212 across the top of the wafer 200 with a squeegee or doctor blade 215, as shown in FIG. 8. The diameter of the solder balls 212 is selected to be more than half the diameter of the openings 206, preferably about 70-80% the diameter of the openings 206. Additionally, the thickness of the dry film resist and the plating thickness of the pillars are selected to leave a remaining depth within the openings 206 of about 70-120% the diameter of the solder balls 212. Given these relative dimensions, one solder ball 212 will be deposited in each opening 206. Passage of the wiping blade 215 over each solder ball 212 will press the ball into the flux 210 while carrying away any surplus balls. If necessary, the blade 215 can make multiple passes over the wafer 200 to ensure that a solder ball 212 has been deposited in every opening 206, and that surplus solder balls have been removed.

Figure 9:
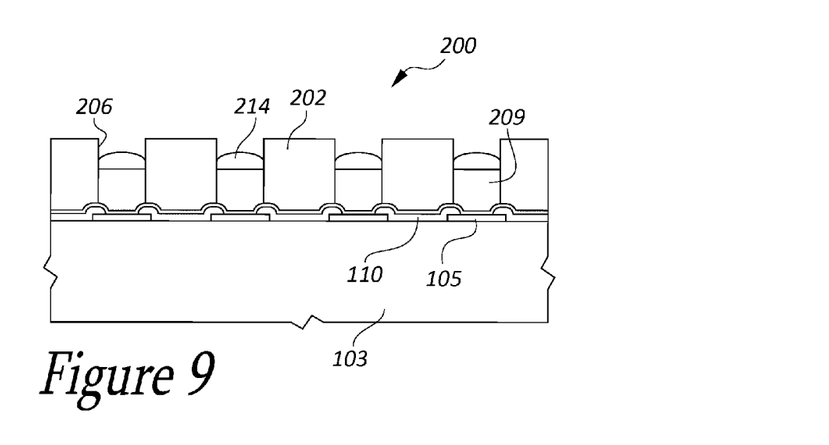
Figure 10:
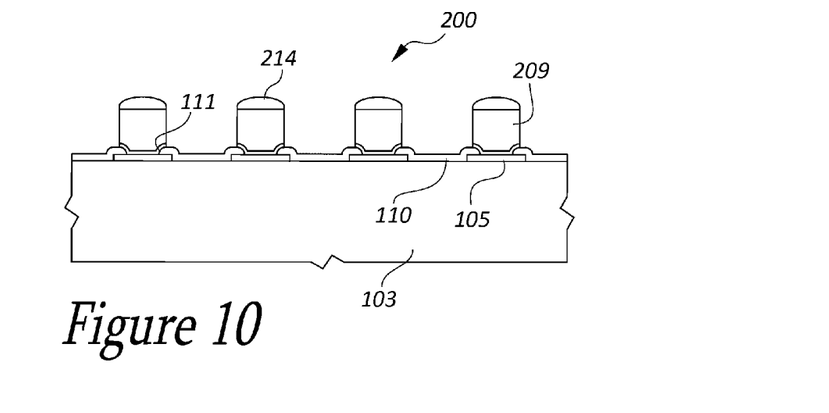

The wafer 200 then undergoes a reflow step in which the solder balls 212 are melted to form solder bumps 214, as shown in FIG. 9. Finally, the resist layer 202 is removed, leaving pillar bumps 216 on the face of the wafer 200, as shown in FIG. 10. The process of removing the resist layer 202 can be performed in a manner that simultaneously removes excess flux.

The process described with reference to FIGS. 6-10 provides a number of benefits. Of particular importance is that the solder balls 212 can be formed of any desired alloy. For example, alloys of tin, silver and copper are often used in ball drop applications. This is in contrast to plated solders, as described with reference to FIGS. 3 and 4, which are limited to binary alloys, such as tin/lead. Another benefit is that clean-up of excess flux is performed in the same process used to remove the resist layer, where in other methods they are separate processes.

While dry film resist is described in the process disclosed with reference to FIG. 6, liquid plating resists can also be used. However dry film resist is preferred because its thickness is determined in a separate manufacturing process and is selected prior to application. In contrast, liquid-based resist is typically applied in a spin-on process, and its final thickness depends on its viscosity and curing, and can vary from the center of a wafer to the edge. Controlling its thickness to within a few microns can be difficult. Additionally, the thickness of a spun-on resist cannot be confirmed until after it is applied to the wafer, so if it is not within specs, it must be removed and reapplied. Finally, most currently available liquid-based resists cannot withstand the temperatures required for reflow of the solder balls.

Figure 11:
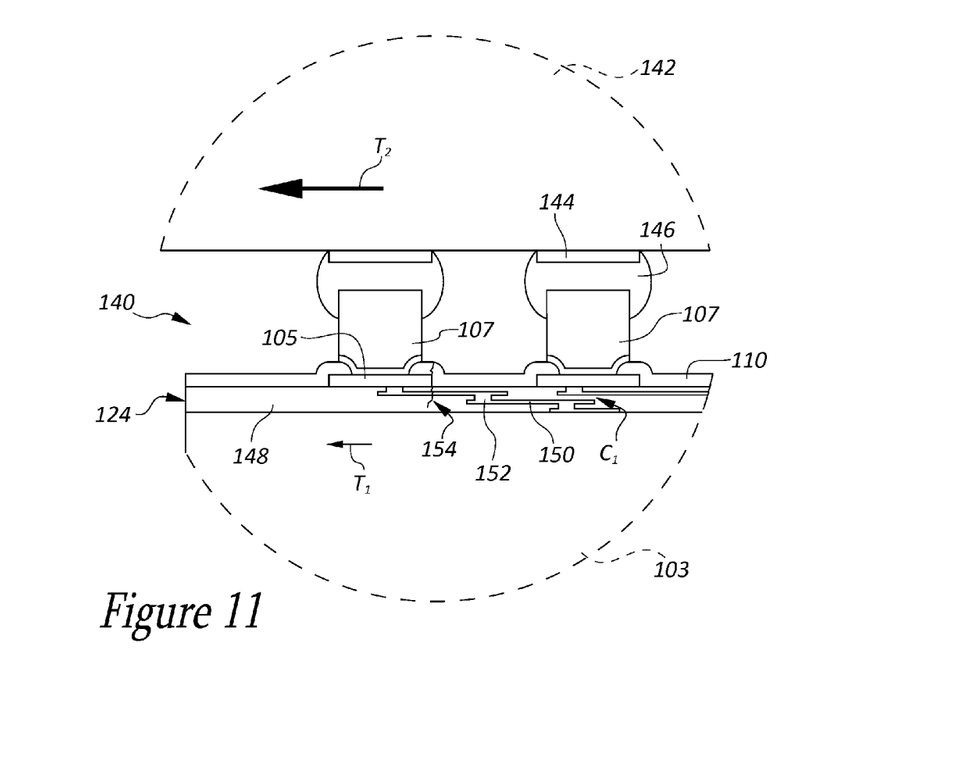
FIG. 11 is an enlarged detail of a portion of a semiconductor die such as might have been cut from the wafer of FIG. 5.

FIG. 11 is an enlarged detail of a portion of a semiconductor die 140, such as might have been cut from the wafer 130 of FIG. 5, mounted to a chip carrier 142. The solder bumps have been reflowed to form solder joints 146 between the Cu pillars 107 and contact pads 144 of the carrier 142, bonding the die 140 to the carrier. FIG. 11 is provided to illustrate a particular problem that has begun to appear as pad pitch has dropped below around about 70-80 µm.

During the manufacturing process of an integrated circuit on a semiconductor substrate, a series of layers of dielectric material are deposited on the substrate, with metallic traces formed between the layers. Each layer is patterned to form openings at selected locations, so that a subsequent metal layer can form a connecting via between the traces of one layer and those of the next. The metallic traces for the wiring of the integrated circuit, connecting the various parts of the circuit, and ultimately providing contact with the contact pads on the front face of the die. The die 140 of FIG. 11 is shown with a metallization layer 148 that includes a plurality of dielectric layers, metallic traces 150 and vias 152. As semiconductor devices become ever more complex and compact, the number of layers of traces and dielectric has also increased. At the same time, the dielectric layers have grown ever thinner, to control die thickness and to improve performance. With thinner dielectrics, parasitic capacitors have become a greater problem at locations where traces of succeeding layers cross, as shown in FIG. 11 at $C_1$. To reduce capacitive coupling, dielectric materials are used that have a small dielectric constant (K) relative to $SiO_2$, commonly referred to as "low-k" materials. However, most types of low-k material are brittle and have relatively poor adhesion.

As previously noted, silicon has a positive CTE of about 2.5 ppm/° C., while the CTE of a typical package laminate base is around 17 ppm/° C. During operation of the device of FIG. 11, the die 140 produces heat that causes the die to expand, so that the ends 124 of the die move away from the center, as indicated by arrow $T_1$. Heat from the die 140 is transmitted via the Cu pillars 107 to the chip carrier 142, which also expands, but because of its much greater CTE, it tends to expand much further, as indicated by arrow $T_2$. The resulting shear stress is applied most strongly to contacts that are farthest from the center of the die, and produces a counter-clockwise torque in the pillars 107 as viewed in FIG. 11, which pulls upward on the right, or inward side of the corresponding contact pad and presses downward on the left, or outward side. This can cause the low-k dielectric layers 148 to crack or delaminate, breaking electrical traces 150 as shown at 154. As disclosed below, embodiments are provided that address this problem.

Figure 12:
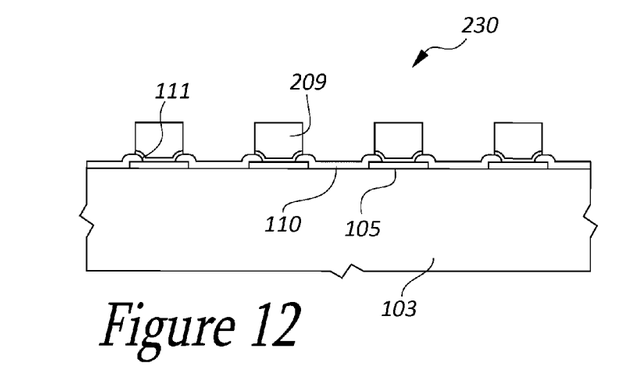
FIGS. 12-16 are diagrammatic side views of a portion of a semiconductor wafer at respective stages of manufacture of pillar bumps, according to another embodiment.

FIGS. 12-16 are diagrammatic side views of a portion of a wafer 230 at respective stages of manufacture of pillar bumps, according to another embodiment. As shown in FIG. 12, pillars 208 are first formed on the substrate 103, using any of the processes described above, and the plating resist is removed.

Figure 13:
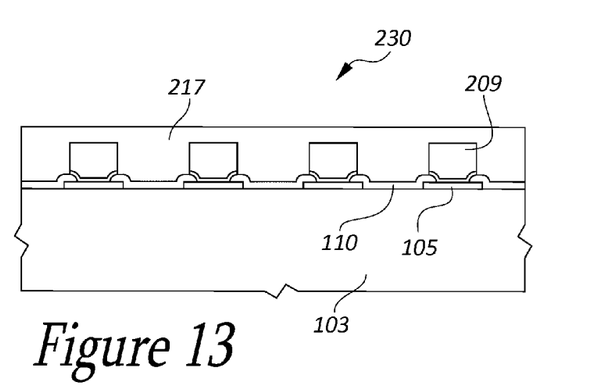
Figure 14:
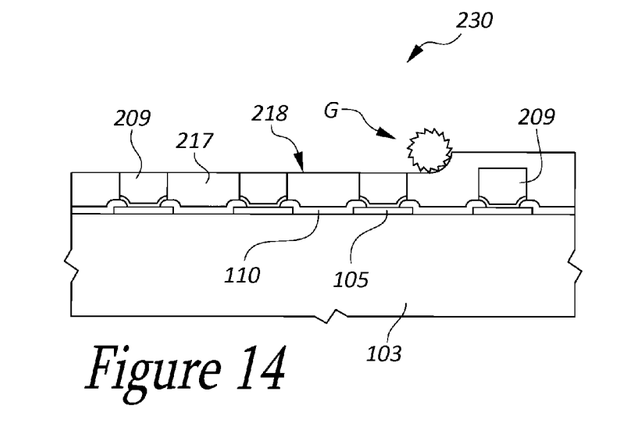

In FIG. 13, a molding compound layer (MCL) 217 is then deposited over the pillars 208 and subjected to a high pressure and heat curing process, completely encapsulating the pillars 208. As shown in FIG. 14, the MCL 217 is thinned, using any appropriate mechanical or chemical process G to expose the front faces of pillars 207 at a new front face 218 of the wafer 230. Preferably, the pillars are reduced by this process to a height of about 20-60 µm.

Figure 15:
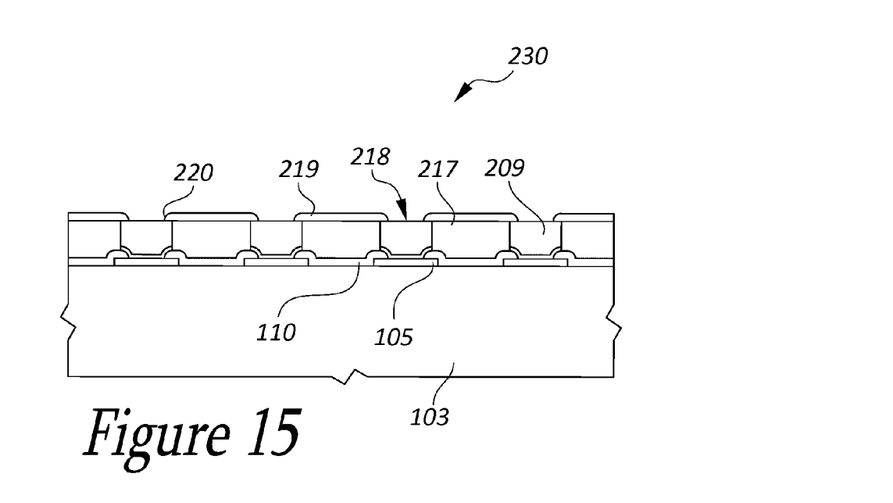
Figure 16:
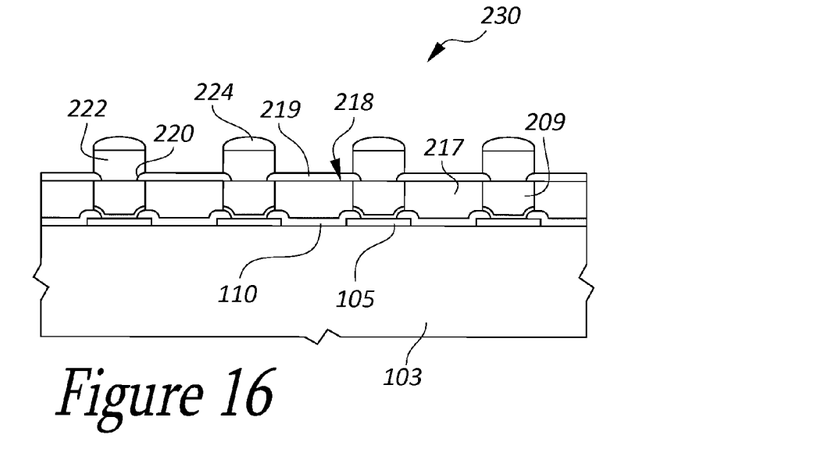

Turning to FIG. 15, a second repassivation layer 219 is deposited on the face 218 and patterned to produce openings 220 over the front faces of the pillars 208. From this point, the process described with reference to FIGS. 6-10 is performed to form a second pillar 222 on top of each of the pillars 208, as shown in FIG. 16, and to form solder bumps 224 on the second pillars 222.

The second pillars 222 are preferably formed by plating the same metal or alloy used to form the pillars 208. Thus, there is no requirement for a seed layer or UBM, and very strong adhesion can be achieved between the pillars 208 and the second pillars 222. According to an embodiment, the height of the second pillars 222 is selected to provide sufficient space for an underfill layer between the wafer 230 and a chip carrier or other receiving substrate, as is known in the art. According to various embodiment, the second pillars 222 are about 20-40 µm in thickness. According to other embodiments, the second pillars 222 are omitted, and the bumps 224 are formed directly on the front faces of the pillars 208, or over an intervening UBM.

In operation, the shear stress and resulting torque described with reference to FIG. 11 are transmitted by the second pillars 222 to the pillars 208 and the MCL 217. Because the pillars 208 are encapsulated and supported by the MCL 217, the stress is not transferred to any significant degree to the dielectric layer or the low-k dielectric layers directly under the pillar, as occurs with the device described with reference to FIG. 11. Instead, the MCL 217 distributes the stress across the face of substrate 203 and eliminates the concentrations of stress, which are most likely to cause structural failure. Additionally, the MCL can be made from a material with a CTE of around 8-10 ppm/° C., which is much closer to that of silicon than that of the typical package laminate base materials. Thus, the MCL can function as a stress buffer to reduce shear stress on the solder joints between the pillars and the contact pads of the package laminate.

Devices that are formed on semiconductor material substrates are generally formed on only one surface thereof, and actually occupy a very small part of the total thickness of the substrate. This surface is generally referred to as the active, or front surface. Likewise, for the purposes of the present disclosure and claims, the terms front and back are used to establish an orientation with reference to a semiconductor wafer or die. For example, where a structure includes a semiconductor die, reference to a front surface of some element of the structure can be understood as referring to the surface of that element that would be uppermost if the structure as a whole were oriented so that the active surface of the die was the uppermost part of the die. Of course, a back surface of an element is the surface that would be lowermost, given the same orientation of the device. Use of either term to refer to an element of such a device is not to be construed as indicating an actual physical orientation of the element, the structure, or the associated semiconductor component, and, where used in a claim, does not limit the claim except as explained above.

In describing the embodiments illustrated in the drawings, directional references, such as right, left, top, bottom, etc., are used to refer to elements or movements as they are shown in the figures. Such terms are used to simplify the description and are not to be construed as limiting the claims in any way.

Ordinal numbers, e.g., first, second, third, etc., are used according to conventional claim practice, i.e., for the purpose of clearly distinguishing between claimed elements or features thereof. The use of such numbers does not suggest any other relationship, e.g., order of operation or relative position of such elements, nor does it exclude the possible combination of the listed elements into a single structure or housing.

Furthermore, ordinal numbers used in the claims have no specific correspondence to those used in the specification to refer to elements of disclosed embodiments on which those claims read.

Molding compounds are substances used to encapsulate semiconductor devices in many different packaging processes, are typically composite materials made from blends of ingredients such as, e.g., resins, hardeners, silicas, catalysts, pigments, and release agents, and are generally provided in a substantially liquid form of a selected viscosity so that they can be injected or poured. Molding compounds are available in a very wide range of formulations from different manufacturers and to meet many different criteria. Accordingly, the term molding compound is to be construed broadly to read on any such compounds.

The unit symbol "μm" is used herein to refer to a value in microns. One micron is equal to $1 \times 10^{-6}$ meters.

The abstract of the present disclosure is provided as a brief outline of some of the principles of the invention according to one embodiment, and is not intended as a complete or definitive description of any embodiment thereof, nor should it be relied upon to define terms used in the specification or claims. The abstract does not limit the scope of the claims.

Elements of the various embodiments described above can be combined, and further modifications can be made, to provide further embodiments without deviating from the spirit and scope of the invention. All of the U.S. patents, U.S. patent application publications, U.S. patent applications, foreign patents, foreign patent applications and non-patent publications referred to in this specification are incorporated herein by reference, in their entirety. Aspects of the disclosed embodiments can be modified, if necessary, to employ concepts disclosed in other patents and patent applications, including any such incorporated herein, and other concepts that are known in the art, to provide yet further embodiments.

These and other changes can be made to the embodiments in light of the above-detailed description. In general, in the following claims, the terms used should not be construed to limit the claims to the specific embodiments disclosed in the specification, but should be construed to include all possible embodiments along with the full scope of equivalents to which such claims are entitled. Accordingly, the claims are not limited by the disclosure.

The invention claimed is:

1. A device, comprising:
   a semiconductor substrate;
   a plurality of contact pads positioned on a front face of the substrate;
   a first plurality of pillars positioned directly over, and in electrical contact with respective ones of the plurality of contact pads, the first plurality of pillars being solid structures that are not hollow;
   a layer of molding compound positioned on the front face of the substrate, surrounding and enclosing side surfaces of each of the first plurality of pillars and having an upper surface that is coplanar with front faces of each of the first plurality of pillars, the layer of molding compound being formed from a flowable material;
   a second plurality of pillars, each positioned over a respective one of the first plurality of pillars, the second plurality of pillars having an upper surface that is spaced apart from the upper surface of the layer of molding compound by side surfaces, a substantial portion of the side surfaces being free of a solid material between adjacent pillars of the second plurality of pillars, the second plurality of pillars being solid structures that are not hollow;
   a plurality of solder bumps, each positioned directly over a respective one of the second plurality of pillars and in electrical contact with respective ones of the first plurality of pillars; and
   a passivation layer positioned over the layer of molding compound and abutting the side surfaces of the second plurality of pillars while maintaining the substantial portion of the side surfaces free of a solid material between adjacent pillars.

2. The device of claim 1 wherein the plurality of contact pads have a pitch of no more than 150 μm.

3. The device of claim 1 wherein the plurality of contact pads have a pitch of no more than 100 μm.

4. The device of claim 1 wherein the plurality of contact pads have a pitch of no more than 60 μm.

5. The device of claim 1, comprising a passivation layer formed on the upper surface of the layer of molding compound and having a plurality of openings in positions corresponding to respective ones of the plurality of contact pads.

6. The device of claim 1 wherein the first plurality of pillars have a first height and the second plurality of pillars have a second height, wherein the first height is greater than the first height.

7. The device of claim 1 wherein the each of the first plurality of pillars has a height of between 40 μm and 70 μm.

8. The device of claim 7 wherein the each of the second plurality of pillars has a height of between 20 μm and 40 μm.

9. A device, comprising:
   a semiconductor substrate;
   a plurality of contact pads positioned on a front face of the substrate and having a pitch of approximately 60 μm;
   a first plurality of pillars positioned over, and in electrical contact with respective ones of the plurality of contact pads; and
   a layer of molding compound positioned on the front face of the substrate, the layer of molding compound surrounding and enclosing sides surface of the first plurality of pillars and having an upper surface that is coplanar with upper surfaces of the first plurality of pillars;
   a second plurality of pillars positioned over the first plurality of pillars respectively, the second plurality of pillars having an upper surface that is spaced apart from the upper surface of the molding compound by side surfaces, a substantial portion of the sides surfaces of the second plurality of pillars being free of a solid material between adjacent pillars;
   a plurality of solder bumps positioned on respective ones of the plurality of pillars, each being an alloy of three or more elements; and
   a passivation layer positioned over the layer of molding compound and abutting the side surfaces of the second plurality of pillars while maintaining the substantial portion of the side surfaces free of a solid material between adjacent pillars.

10. The device of claim 9 wherein the first plurality of pillars are copper.

11. The device of claim 9 wherein each of the first plurality of pillars has a height of between 40 μm and 70 μm.

12. The device of claim 9 wherein each of the first plurality of pillars has a height of about 60 μm.

13. The device of claim 9 wherein the first and second plurality of pillars are solid structures that are not hollow.

* * * * *